US010206298B2

(12) United States Patent
Memering et al.

(10) Patent No.: US 10,206,298 B2
(45) Date of Patent: Feb. 12, 2019

(54) WITNESS LAYERS FOR GLASS ARTICLES (71) Applicant: Apple Inc., Cupertino, CA (US)

(72) Inventors: Dale N. Memering, Cupertino, CA (US); Dezheng Qu, Cupertino, CA (US); Victor Luzzato, Taipei (TW)

(73) Assignee: APPLE INC., Cupertino, CA (US)

( * ) Notice: Subject to any disclaimer, the term of this patent is extended or adjusted under 35 U.S.C. 154(b) by 143 days.

(21) Appl. No.: 15/134,973

(22) Filed: Apr. 21, 2016

(65) Prior Publication Data
US 2017/0311466 A1 Oct. 26, 2017

(51) Int. Cl.
*C03C 21/00* (2006.01)
*H05K 5/03* (2006.01)
*C03C 3/00* (2006.01)
*C03C 4/18* (2006.01)
*H05K 5/00* (2006.01)

(52) U.S. Cl.
CPC ............... *H05K 5/03* (2013.01); *C03C 3/00* (2013.01); *C03C 4/18* (2013.01); *C03C 21/003* (2013.01); *H05K 5/0017* (2013.01); *H05K 5/0086* (2013.01); *C03C 2204/00* (2013.01)

(58) Field of Classification Search
None
See application file for complete search history.

(56) References Cited

U.S. PATENT DOCUMENTS

| 3,410,673 A | 11/1968 | Marusak |
| 3,433,611 A * | 3/1969 | Kubichan ............. C03C 21/002 501/63 |
| 7,497,093 B2 | 3/2009 | Rosenflanz |
| 8,003,217 B2 | 8/2011 | Rosenflanz |
| 8,840,997 B2 | 9/2014 | Koyama et al. |
| 9,249,045 B2 | 2/2016 | Gabel et al. |
| 9,718,727 B2 | 8/2017 | Bookbinder et al. |
| 9,897,574 B2 | 2/2018 | Roussev et al. |
| 2012/0052271 A1 * | 3/2012 | Gomez ................... C03C 3/091 428/213 |
| 2012/0236526 A1 | 9/2012 | Weber |

(Continued)

FOREIGN PATENT DOCUMENTS

DE 102016107630 10/2017
WO WO2012/027660 3/2012

(Continued)

OTHER PUBLICATIONS

International Search Report and Written Opinion, PCT/US2017/028193, 13 pages, dated Jun. 26, 2017.

*Primary Examiner* — David Sample
(74) *Attorney, Agent, or Firm* — Brownstein Hyatt Farber Schreck, LLP (57) ABSTRACT

Glass articles having a base layer formed of glass and having a first compressive stress, an adjacent compression layer formed in the glass and having a second compressive stress, and a witness layer formed in the glass adjacent the compression layer and having a third compressive stress. The first, second and third compressive stresses all differing from one another. The witness layer also having a higher index of refraction than an index of refraction for the base or compression layers. Methods for manufacturing and methods of quality control that include the use of the witness layer are also disclosed.

20 Claims, 6 Drawing Sheets

(56) References Cited

U.S. PATENT DOCUMENTS

| | | | | |
|---|---|---|---|---|
| 2013/0224492 A1* | 8/2013 | Bookbinder | .......... | C03C 21/002 428/410 |
| 2014/0078412 A1* | 3/2014 | Franklin | ............... | G06F 1/1643 349/12 |
| 2014/0370264 A1* | 12/2014 | Ohara | ................... | G06F 1/1626 428/220 |
| 2015/0030834 A1* | 1/2015 | Morey | .................. | C03C 21/002 428/220 |
| 2016/0373564 A1* | 12/2016 | Motohashi | ................ | G06F 1/16 |
| 2018/0086663 A1 | 3/2018 | Luzzato et al. | | |

FOREIGN PATENT DOCUMENTS

| | | |
|---|---|---|
| WO | WO2012/074983 | 6/2012 |
| WO | WO2015/0031420 | 3/2015 |
| WO | WO2016/065118 | 4/2016 |

* cited by examiner

WITNESS LAYERS FOR GLASS ARTICLES

FIELD

The present disclosure relates generally to witness layers for use on glass and, more particularly, witness layers for use on sodium strengthened lithium glass.

BACKGROUND

Lithium ion containing glass (lithium glass) is becoming more desirable for use in portable electronic devices. As the use of lithium glass increases in these smaller and higher tolerance electronic devices, fabrication of thinner and stronger lithium glass is required. One such lithium glass is sodium strengthened lithium glass, a lithium glass that includes a surface strengthened with sodium ions.

Thin layers of sodium strengthened lithium glass can be formed by diffusing sodium ions into the surface of the lithium glass, where the smaller lithium ions are exchanged for much larger sodium ions. Exchange of smaller for larger radius ions results in the formation of a diffusion layer or compression layer, often 50 to 300 μm in thickness. As such, sodium strengthened lithium glass typically includes an internal portion and a coated compression layer.

Defects in the compression layer can have a significant impact on the utility of the lithium glass, as well as on the utility of the devices that incorporate the glass. Defects can either be inherent to a particular piece of glass or be introduced to the compression layer during post-processing events, like touch polishing. Removal or sacrifice of material from the surface of the glass can result in inconsistent and weakened compression layers.

Once a portable electronic device has been manufactured, a defective glass article can result in the loss of the entire product. Identifying defects in sodium strengthened lithium glass represents a significant concern in the art, as there are no practical non-destructive methods for identifying defects in a compression layer. As such, there are no non-destructive methods for identifying defective sodium strengthened lithium glass.

SUMMARY

Various embodiments described herein encompass a glass article having a base layer, a compression layer and a witness layer. The base layer is formed in a glass and has a first compressive stress. The compression layer is adjacent the base layer and is formed in the glass, having a second compressive stress. The witness layer is adjacent the compression layer and is formed in the glass, having a third compressive stress. The first, second and third compressive stresses all differing from one another. In some aspects, the third compressive stress exceeds the second compressive stress, and the second compressive stress exceeds the first compressive stress.

In additional embodiments, the base layer is formed of a lithium-diffused glass (lithium glass herein), the compression layer is formed of a sodium-diffused glass, and the witness layer is formed of a potassium-diffused glass. The compression layer is typically sandwiched between the base layer and the witness layer, with the witness layer covering some or all of the compression layer. In some aspects, the base layer is enclosed on all sides by the compression layer, thereby forming an internal or interior base glass.

In some aspects, the witness layer has a higher index of refraction than either the base layer or the compression layer. The witness layer is typically characterized by an index of refraction that allows for optical detection through fringe stress measurement, for example.

Embodiments also include portable electronic devices that include glass articles in accordance with the disclosure as well as to the methods of manufacturing the same portable electronic devices. In some aspects, the portable electronic devices undergo polishing or other post-processing events.

In method embodiments, a base glass is contacted with sodium ions such that a compression layer is formed at the surface of the base glass, having a compressive strength that exceeds the base glass. A witness layer is formed on some or all of the compression layer by contacting the sodium-diffused compression layer with potassium ions. The witness layer has a compressive stress that exceeds the compressive stress of the compression layer and has an index of refraction that exceeds the index of refraction for either the compression layer or base layer. In some embodiments, the base glass is a lithium-diffused glass.

Other features and advantages of the present disclosure will be apparent from the accompanying drawings and from the detailed description that follows below.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Embodiments of the disclosure relate to witness layers for use on glass articles, for example cover glass, and to the methods of preparing the same.

Embodiments of the disclosure also relate to methods of manufacturing witness layer containing glass articles, and to using the witness layers on the glass articles to non-destructively identify compromised glass articles.

The glass and glass articles and methods disclosed herein can be implemented in numerous ways, including as glass pieces such as cover glass or displays for various electronic devices including portable electronic devices. The methods disclosed herein can be implemented to non-destructively identify acceptable glass for use as glass pieces in various electronic devices, including implemented to non-destructively identify acceptable glass in an automated manufacturing process.

Glass articles in accordance with embodiments herein have a base layer formed in a glass, the base glass having a first compressive stress. The base layer is typically any useful type of glass (silicate, soda, and the like) and can include quantities of $SiO_2$, $Na_2O$, $Al_2O_3$, $Br_2O_3$, $CaO$, $ZrO_2$, $MgO$ and the like.

In some embodiments, the base glass is infused with lithium ions, which can represent from 0.1 to 10% by weight of the base glass, although other lithium weight percent's are contemplated. The inclusion of lithium in the base glass puts the glass in a first compressive stress, as compared to the same base glass without lithium ions. Base layers can be of any thickness, but are typically from 0.5 to 4 mm thick, and more typically 0.5 to 3 mm thick. Lithium glass is typically tougher than non-lithium infused glass.

Glass articles in accordance with embodiments herein typically have a compression layer formed in the base glass, the compression layer having a second compressive stress. The compression layer differs from the base glass in that it typically has a compressive stress that exceeds the compressive stress of the base glass.

In one embodiment, the compressive layer is infused with sodium ions. In this embodiment, where the base glass is infused with lithium ions, the compression layer differs from the base glass in that it has a lower content of lithium ions and a greater content of sodium ions. Also in this embodiment, compression layers are formed by the exchange of lithium ions for sodium ions, as sodium ions have a larger ionic radius than lithium ions and thereby increase the compressive stress within the layer. The increase in sodium results in an increase in the strength of the lithium glass surface. Compression layer depth and ion concentration are based on a thermally activated interdiffusion process, as that compression layer attributes can be predetermined. In typical compression layers, the sodium depth is 40-300 μm into the surface of the lithium glass, but typically does not extend beyond 10% of the total thickness of the base layer. For example, a base layer having 1 mm thickness would typically be covered by a 1-100 μm, and more typically 10-100 μm, thick compression layer. Generally, the sodium strengthened compression layer is difficult or impossible to detect within optical measuring systems due to its very low index of refraction. For example, use of fringe stress measurement, a surface stress measurement, provides no readout when used on a sodium-diffused compression layer.

Glass articles in accordance with embodiments herein typically have a witness layer formed in the surface of the compression layer glass. The witness layer has a third compressive stress. In some aspects, the witness layer forms in some, or all, of the compression layer.

In some embodiments, where the base glass is diffused with lithium ions and the compression layer is diffused with sodium ions, the witness layer is potassium rich, having a lower content of sodium ions but a greater content of potassium ions than the compression layer. Witness layer depth and potassium ion concentration are based on a thermally activated interdiffusion process, where sodium and lithium ions are exchanged for potassium ions. It is typical for the witness layer to replace up to 75%, but more typically 50%, and most typically 1-20% of the compression layer (by depth). In some aspects, the witness layer is formed by a spike of potassium, enough of a layer to allow for optical monitoring, but not so thick or concentrate as to significantly increase the central tension within the compression layer. The witness layer can be as shallow as 5-10 μm. The witness layer allows detection by optical measurement, including fringe stress measurement. Typical witness layers for use herein have an optically detectable high index of refraction, which provides a non-destructive measurement for surface stress.

As such, embodiments of the disclosure have a base layer with a first compressive stress, a compression layer with a second compressive stress, and a witness layer with a third compressive stress. In some aspects, the witness layer's third compressive stress exceeds the compression layer's second compressive stress, and the compression layer's second compressive stress exceeds the base layer's first compressive stress. In other aspects, the witness layer's index of refraction is optically detectable, and exceeds the index of refraction for the compression layer and/or base layer. In other aspects, the compression layer is not optically detectable.

Unexpectedly, witness layers, in accordance to embodiments herein, exhibit detectably high refractive indices, which allows non-destructive use of light to detect the witness layer and, thus, the glass article's surface stress and quality. The compression layer, on the other hand, is characterized as having an index of refraction so low that optical detection methods are ineffective. As such, inclusion of the witness layer on or in the compression layer allows for non-destructive optical detection. This detection methodology allows for an objective determination of a glass article's quality without necessitating destructive batch sampling.

The witness layer's relatively high compression and strength, combined with its beneficial optical properties, allows it to act as both a high strength surface for the sodium strengthened lithium glass, as well as a means for detecting both consistency of, and defects in, the compression layer. The witness layer can be used during glass part preparation to identify inferior quality glass articles, including glass articles that have been damaged during post processing modification(s).

Embodiments also include methods of fabricating a base glass having a compression layer and a witness layer. In one embodiment, for example, a sodium strengthened lithium glass having all, or a portion of all, its surface covered by a witness layer is fabricated. A lithium glass of appropriate thickness and strength is exposed to a sodium ion bath at a temperature below the lithium glasses transition temperature. (The term "bath," as used herein, also encompasses, sprays, drips, depositions, and the like.) The lithium glass remains exposed until a sufficient concentration of sodium ions have diffused to an appropriate depth of the lithium glass to form a compression layer. In typical embodiments, the compression layer is held to a depth of 10% or less of the entire thickness of the sodium strengthened lithium glass. The sodium strengthened lithium glass is then exposed to a potassium bath at a temperature below the sodium strengthened lithium glass transition temperature, for a period of time until a sufficient concentration of potassium ions has diffused to an appropriate depth of the compression layer to form a witness layer. In typical embodiments the witness layer is meant to be a spike that exchanges out sodium for potassium, and allows for the improved optical characteristics of potassium (index of refraction), but not to an extent that the potassium causes dramatic or significant increases in the central tension of the compression layer.

In some aspects, the sodium strengthened lithium glass is only partially exposed or contacted in the potassium bath (or other form of exposure) in order to leave some areas of the compression layer in the absence of a witness layer. This may occur, for example, if a portion of sodium strengthened lithium glass will not be the target of optical monitoring or any post processing procedures, and therefore has a much lower likelihood of a defect being introduced into the compression layer. For example, portions of the sodium strengthened lithium glass that are on interior surfaces and cannot be accessed by fringe stress measurement (FSM), for example.

In some embodiments, the glass articles in accordance with embodiments herein, undergo post-processing, for example, touch polishing, to allow for more precise fitting of the glass in an electronic device or the like. Upon completion of the post-processing, a non-destructive optical reading is taken in the area of the article that was post-processed. Where some, but not all, of the witness layer was removed, the witness layer is optically detectable, and the glass considered acceptable (the compression layer would also by default be present under the remaining witness layer). A second round, and so forth, of touch polishing and witness layer identification/detection may be completed. In some aspects the non-destructive optical reading is performed by fringe stress measurement (FSM). When the witness layer is no longer optically detectable, the glass article may have had some amount of compression layer removed, introducing a possible defect.

Embodiments described herein also include methods for fabricating a sodium strengthened lithium glass having some, or all, of its surface covered by a predetermined thickness of potassium rich witness layer. The predetermined thickness generally ensures that the witness layer can withstand post-processing. This may facilitate and/or simplify large-scale manufacturing.

As will be described in greater detail below, some amount of the witness layer may be removed from the glass articles during post-processing procedures, yielding a witness layer that may exhibit various thickness on the compression layer, for example, one area of witness layer may be 10 µm thick, and a second area of the witness layer may be 20 µm thick. However, even where the witness layer on a glass article has a disproportionate thickness, the underlying compression layer typically has a consistent thickness and, therefore, strength. As such, any optical detection of a witness layer in a post-processed area is a strong indication that the glass article is not compromised.

Embodiments also include quality control methods for confirming the utility of witness layer containing glass articles. For example, the quality control of sodium strengthened lithium glass having undergone one or more post-processing steps. Glass articles confirmed to have a witness layer, in accordance with embodiments herein, are confirmed for use in portable electronic devices, and show significant improvement over other glass not having a witness layer. Quality control by FSM, or other like optical detection method, may be performed on some or all glass prior to being incorporated into target portable electronic devices.

Embodiments herein are described in greater detail with reference to FIGS. 1-6.

Figure 1:
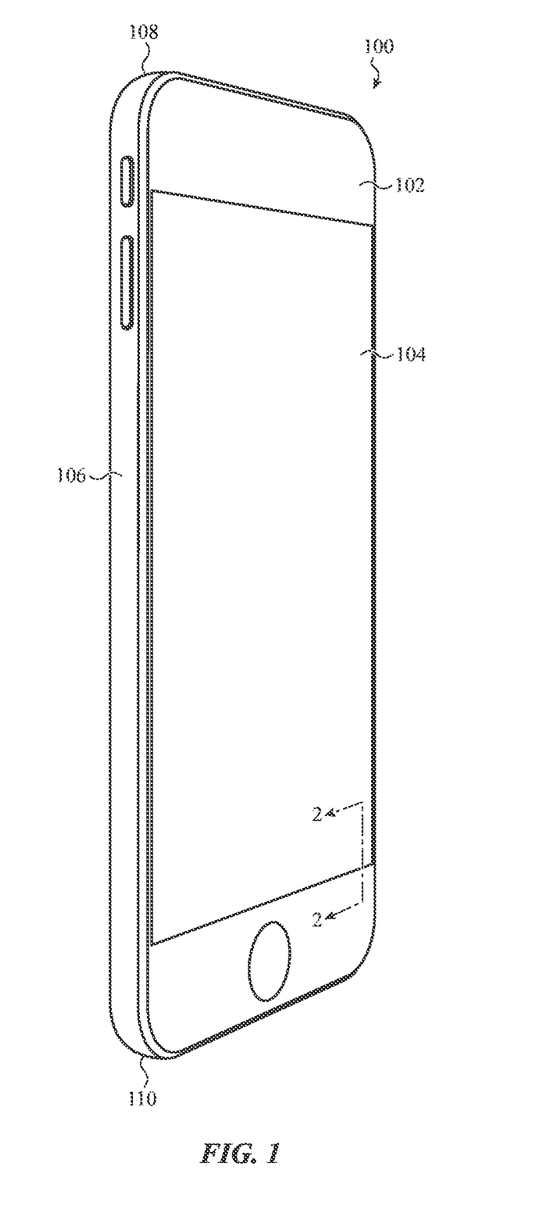
FIG. 1 is a diagrammatic representation of a handheld electronic device showing a sapphire frame capturing a cover glass.

With reference to FIG. 1, a portable electronic device 100 is described in accordance with an embodiment disclosed herein. A portable electronic device may include a frame 102 that surrounds a cover glass 104. The frame has a side 106, top 108 and bottom 110 as shown (back cover not shown). The frame 102 may be made of sapphire or other extremely hard material. The cover glass 104 can be a glass article in accordance with embodiments described herein. The portable electronic device 100 is stronger and more impact resistant than other devices as it includes both the sapphire frame and a cover glass article with compression and layer. In one embodiment, the portable electronic device in FIG. 1 is a sodium strengthened lithium glass having a protective potassium rich witness layer.

Figure 2A:
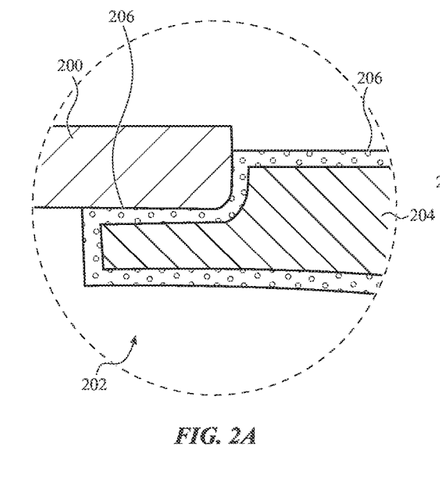
FIG. 2A is a cross-sectional schematic representation along line 2-2 of FIG. 1 showing a cover glass article having a base glass and surface compression layer.

FIG. 2A shows an illustrative cross sectional schematic along line 2-2 of FIG. 1. In FIG. 2A, a sapphire frame 200 is joined to a cover glass 202 having a base layer 204 and a compression layer 206. FIG. 2A shows that the sapphire frame 200 sits above the cover glass 202, thereby potentially requiring a post-processing event to flatten the sapphire to match the height of the cover glass. Post-processing the sapphire down to the cover glass may result in the loss of cover glass so as to ensure that the two surfaces match and are flat.

Figure 2B:
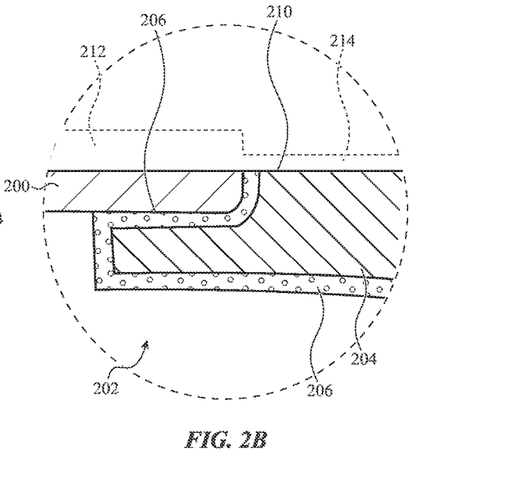
FIG. 2B is a cross-sectional schematic representation along line 2-2 of FIG. 1 showing sacrifice of the compression layer from the base glass when the sapphire frame is made flat with the cover glass article of FIG. 2A.

FIG. 2B shows another illustrative cross-sectional schematic along line 2-2 of FIG. 1 after the sapphire frame and cover glass of FIG. 2A have been processed. In FIG. 2B, the compression layer 206 and sapphire frame 200 are polished down to form a flat joining surface 210. In preparing the flat surface between the sapphire and cover glass, removal of some sapphire frame (dotted line 212) and some or all of compression layer (see dotted line 214) on the base glass 204 can be expected (loss of compression layer would correspond to where the cover glass was processed). As shown in FIG. 2B, the base glass 204 now has an area that does not include a compression layer 214. Removal of the compression layer 214 from the base glass may form an undetectable defect in the cover glass. Monitoring of the surface stress in the defective cover glass is not possible because the refractive index of the compression layer is not detectable (discussed in greater detail in FIG. 3).

Figure 2C:
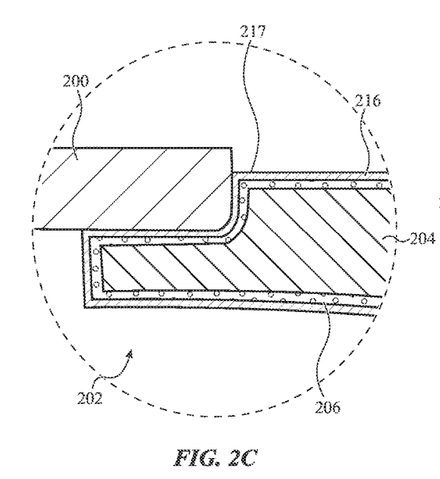
FIG. 2C is a cross-sectional schematic representation along line 2-2 of FIG. 1 showing a cover glass article having a surface compression layer sandwiched between a base glass and a witness layer.
Figure 2D:
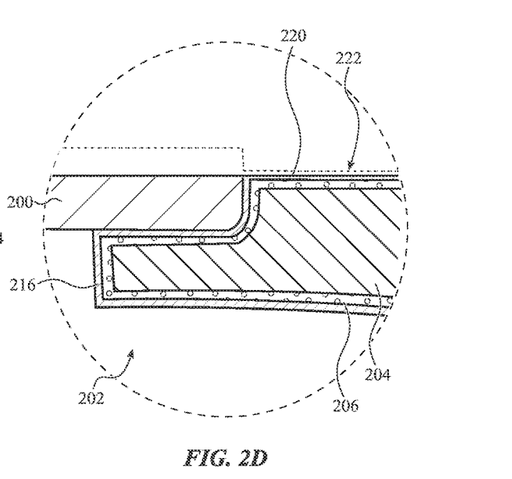
FIG. 2D is a cross-sectional schematic representation along line 2-2 of FIG. 1 showing sacrifice of a portion of the witness layer from the compression layer when the sapphire frame is made flat with the cover glass article of FIG. 2C.

FIGS. 2C and 2D show the same cross sectional schematic along line 2-2 of FIG. 1 as was shown in FIGS. 2A and 2B. However, in FIGS. 2C and 2D, the base glass includes a witness layer. As in FIGS. 2A and 2B, the schematic represents a before (2C) and after post-processing event (2D).

FIG. 2C shows that, prior to any post processing, the cover glass has an internal portion 204, a compression layer 206 and a witness layer 216. The sapphire frame 200 sits on the cover glass as in FIG. 2A, and extends above the cover glass surface 217. The witness layer 216 in FIG. 2C is optically detectable by FSM or other like optical method and provides an indication of the witness layer's surface stress. The witness layer 216 covers the entire compression layer in this FIG.

FIG. 2D illustrates the same cross sectional view as shown in FIG. 2C, except that the sapphire frame 200 is processed down to match the surface of the witness containing cover glass 218.

In FIG. 2D, a high tolerance joining is required such that the cover glass 218 and sapphire frame 200 are flat to each other. Unlike in FIG. 2B, removal of material to create the flat surface results in removal of the witness layer 216 and not the compression layer 206 (see dotted line 220. Optical monitoring of the witness layer 216 is an objective indicator as to the presence of both the remaining witness layer 216 and compression layer 206 of the cover glass 218.

If the post processing procedure removes the witness layer 216, the cover glass 218 no longer has a detectable index of refraction, and would therefore be unacceptable, as the intactness of the compression layer would be suspect. In FIG. 2D, enough witness layer remains for optical detection using FSM (or other like method), thereby confirming the presence of the underlying compression layer (see arrow 222).

Figure 3A:
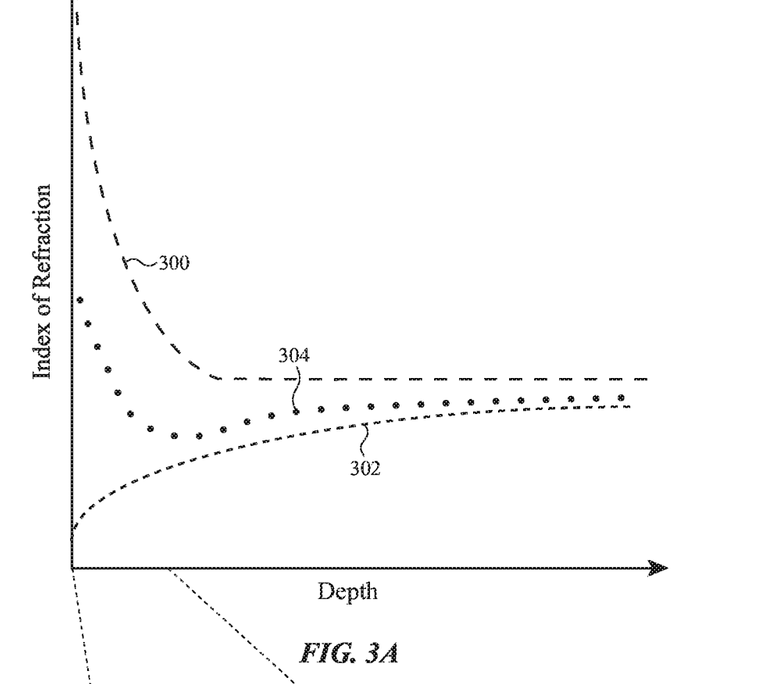
FIG. 3A is a graphical representation showing the index of refraction of a sodium for lithium exchange, a potassium for sodium exchange, and the resultant index of refraction when the potassium exchange is performed on a sodium strengthened lithium ion glass article.

FIG. 3A illustrates the optical properties of a glass article in accordance with embodiments herein. In this embodiment, the Y-axis of the graph is the index of refraction, and the X-axis corresponds to the glass's depth. Index of refraction measurements were made at increasing depths on a sodium strengthened lithium glass, and on a potassium strengthened sodium glass. The index of refraction was also measured at increasing depths on a lithium-diffused glass article having a sodium compression layer and potassium rich witness layer (glass articles in accordance with embodiments herein).

The potassium strengthened sodium glass shows a very high index of refraction at shallow depths as indicated by curve 300. The sodium strengthened lithium glass shows very low index of refraction over the same depths, as indicated by curve 302. The index of refraction for the glass article having both the sodium compression and witness layers, shows a significant increase in index of refraction at shallow depths, that allows for FSM monitoring (as compared to the sodium strengthened lithium glass 302), as is indicated by curve 304. Note that inclusion of potassium corresponds, with the increase in the glass article's index of refraction 304, can be seen when comparing curves 300 and 304. This FIG. shows the utility of using potassium ions to increase the index of refraction in a target piece of glass.

Figure 3B:
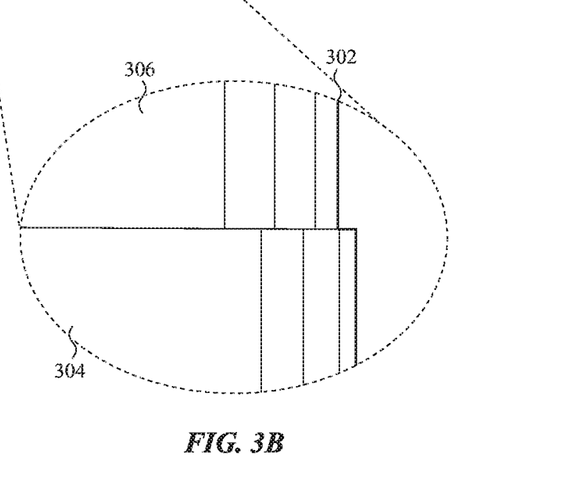
FIG. 3B shows a Fringe Stress Measurement (FSM) pattern corresponding to the graph in FIG. 3A.

FIG. 3B shows a corresponding FSM pattern having an optical readout for each curve 300, 302, and 304 at the indicated depth. The sodium strengthened lithium glass 302 had no detectable pattern by FSM, whereas the potassium containing glass (witness layers) provided an optical and readable compression layer. This shows the significant utility of using a witness layer to allow for FSM detection on these compression layer containing glass articles.

The following flow diagrams, FIGS. 4-6, will be described in relation to a base layer of lithium glass, a compression layer of sodium-infused glass, and a witness layer of potassium-infused glass. Other combinations are within the scope of the disclosure as long as the witness layer has a compressive stress in excess of the compression layer's compressive stress, and the compression layer's compressive stress is in excess to the base layer's compressive stress. Further, it is advantageous for the witness layer to have an index of refraction that allows for optical detection, particularly by FSM.

Figure 4:
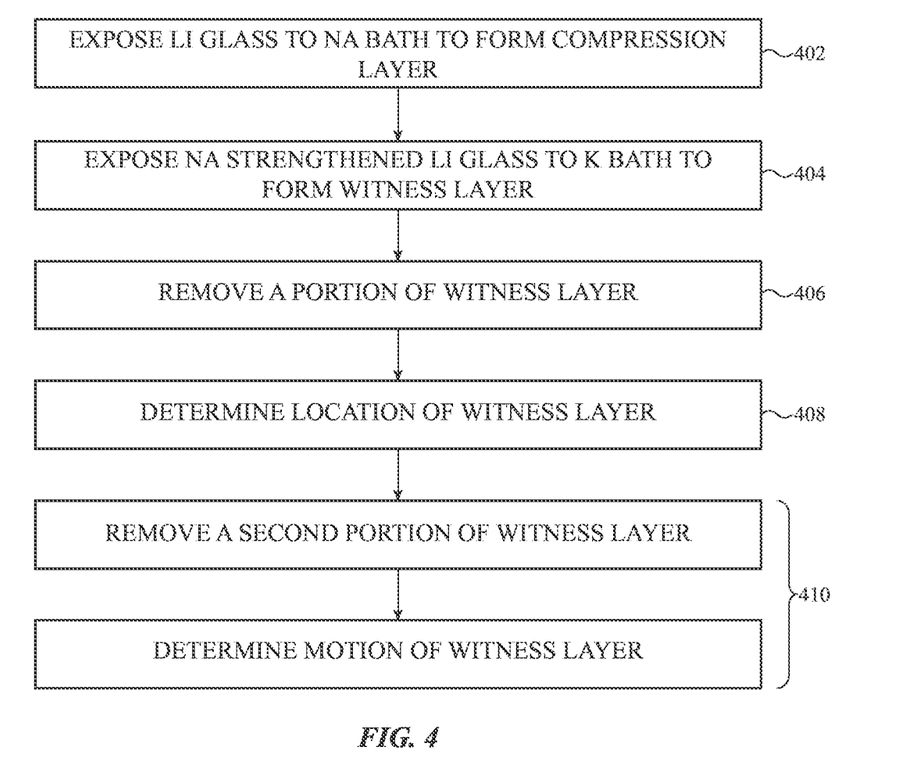
FIG. 4 is a flow diagram which illustrates one method of processing a lithium ion glass to include both a compression and witness layer.

FIG. 4 is a flow diagram of one embodiment for manufacturing base glass to include both a compression layer and witness layer. In one embodiment, the base glass is lithium glass. Lithium glass typically includes both a base glass and a certain weight percent of lithium ions. In some aspects the lithium ions represent up to 10%, or more, of the total weight of the base glass. A piece of lithium glass having a target utility (area, thickness and percent lithium ion) is obtained and exposed to a molten sodium bath 402. In one aspect the sodium ions are provided by sodium nitrate. The temperature of the sodium bath is typically below the lithium glass's transition temperature.

Once an acceptable sodium compression layer has been formed through thermal diffusion, the glass is cooled and then exposed in a molten potassium bath to form the witness layer 404. Both the compression and witness layers are immersed at an ion concentration, temperature, and pressure to form their appropriate layer depth. Due to diffusion and internal stress parameters, the compression layer should be about 10% or less of the total thickness of the finished glass article. The compression layer provides an increase in strength due to the crowding out of the lithium ions by the larger atomic radius of the sodium atoms. The witness layer need only be deep enough to provide a monitoring layer as shown in FIG. 3. However, where sacrifice of material due to post processing is contemplated, the witness layer should be deep enough to be sacrificed, but still allow for FSM monitoring, i.e., after sacrifice by post processing enough witness layer remains for FSM monitoring. However, this depth is limited by not wanting to increase the central stress in the compression layer and thereby introducing potential defects into the glass. A witness layer in a sodium strengthened lithium glass may be polished to remove surface defects 406 and monitored using FSM to ensure that the polished glass is still acceptable for its intended use 408. The process of post processing a witness layer may be performed as many times as necessary to remove the surface defect and still be monitored through the presence of the witness layer 410. When a post processing procedure has removed the entire witness layer there is no longer an objective detection method to confirm the existence of the intact underlying compression layer. Where the entire witness layer has been removed by post processing procedures, the glass may be deemed unacceptable.

Figure 5:
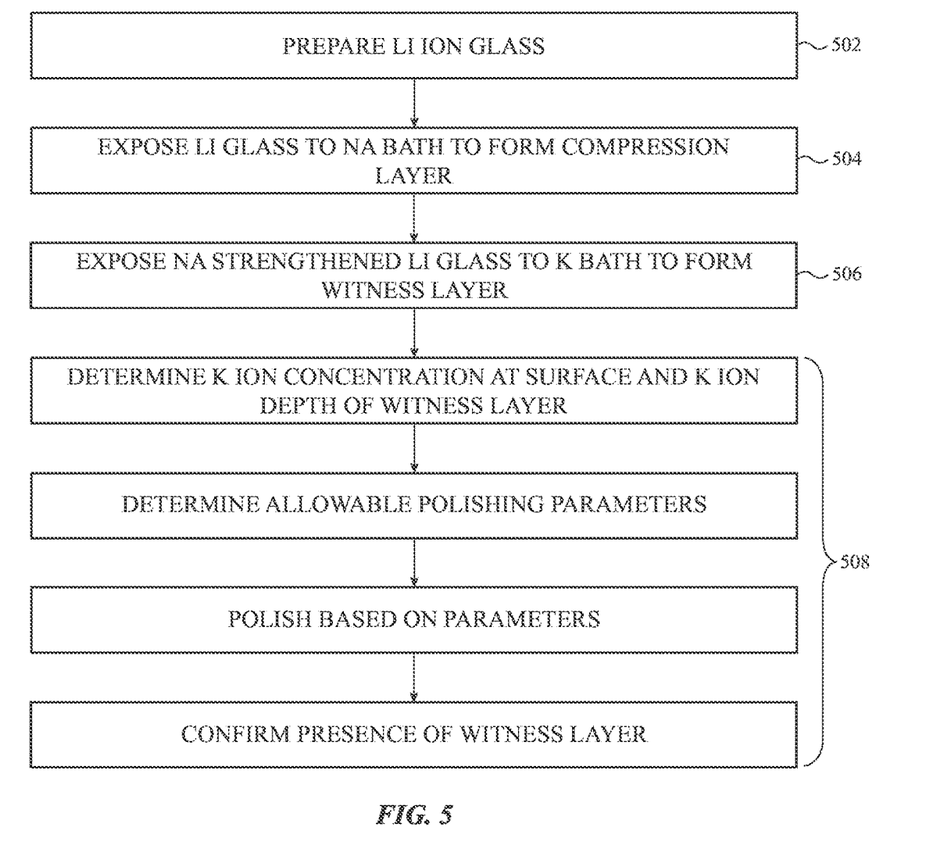
FIG. 5 is a flow diagram which illustrates one method of confirming that a post processed sodium strengthened lithium ion glass has not been compromised.

FIG. 5 is a flow diagram of another embodiment for identifying and utilizing a witness layer for high throughput manufacturing of witness layer containing sodium strengthened lithium glass. As described above, a lithium glass for use in an automated or high throughput manufacturing process is identified and an appropriate compression and witness layer fabricated using diffusion layers 502, 504, 506. In this embodiment, a standard post processing procedure is known, as is the amount of witness layer required to be sacrificed (for example by forming a flat surface joint). The witness layer parameters are made consistent as are the, for example, touch processing parameters. During manufacture of numerous witness layer covered articles, the same parameters are used to prepare the same layer on each glass item with the same amount of potassium ion and to the same depth. Predetermined or random FSM checks are made on the manufactured items to ensure that each has the same amount of witness layer left after post processing. The presence of the witness layer allows for a simple monitoring solution for automated or high throughput manufacturing of parts, where an indicator that the witness layer is not of an expected FSM image results in the manufacturing process being halted and reconfigured.

Figure 6:
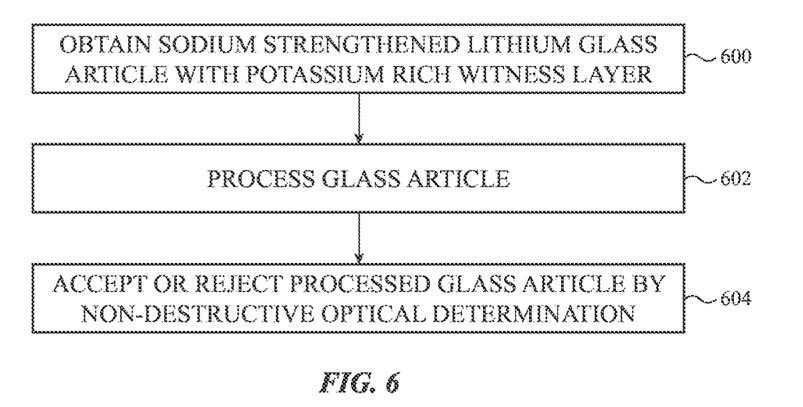
FIG. 6 is a flow diagram which illustrates one quality control method for accepting or rejecting a post processed sodium strengthened lithium ion glass.

FIG. 6 is a flow diagram that illustrates that the inclusion of a witness layer on sodium strengthened lithium glass allows for quality control monitoring of this glass using non-destructive optical devices 600. Non-destructive monitoring is typically accomplished by FSM imaging 602. Quality control monitoring allows for the detection of unacceptable sodium strengthened lithium glass prior to use in a portable electronic device, for example. In addition, quality control monitoring can be performed on a 100% of the fabricated sodium strengthened lithium glass before or after inclusion in a portable electronic device 604.

While the invention has been particularly shown and described with reference to a number of embodiments, it would be understood by those skilled in the art that changes in the form and details may be made to the various embodiments disclosed herein without departing from the spirit and scope of the invention and that the various embodiments disclosed herein are not intended to act as limitations on the scope of the claims.

EXAMPLES

The following examples are provided for illustrative purposes only and are not intended to limit the scope of the invention.

Example 1

Witness layer inclusion on a sodium strengthened lithium ion glass article allows for significant post processing without loss of glass strength. A potassium rich witness layer for quality control of sodium strengthened lithium glass allows for between 30 and 120 seconds of touch polishing without any corresponding loss of strength.

In this example, some touch polishing is helpful in actually increasing the strength of the potassium rich witness layer containing sodium strengthened lithium glass as is shown between the No Re-polish reading (1528.9) and the 30 to 120 seconds of touch polishing readings (2123.0 to 2199.4). The data indicates that the potassium rich witness layer allows for continued article strength even after significant touch polishing.

Example 2

This example illustrates the non-destructive FSM images of a sodium strengthened lithium ion glass and the same glass including a potassium rich witness layer are significantly different.

In this example, it is apparent that in the absence of a witness layer the FSM image is black and provides no information. However, the thin potassium rich witness layer allows for a FSM image providing data on both the surface concentration of the potassium (spacing of lines) and the depth to which the layer extends (total distance between lines). This shows the utility of including a witness layer on a glass article as compared to having no witness layer, and therefore no data.

What is claimed is:

1. A glass article, comprising:
    a base layer formed in a glass and having a first compressive stress;
    a compression layer formed in the glass and having a second compressive stress, the compression layer adjacent the base layer;
    a witness layer formed in the glass and adjacent the compression layer and having a third compressive stress; wherein
    the first, second and third compressive stresses all differ; and
    the witness layer defines:
        a first thickness at a first location of the glass article; and
        a second thickness, greater than the first thickness, at a second location of the glass article that is different than the first location.

2. The glass article of claim 1, wherein:
    the second compressive stress exceeds the first compressive stress; and
    the third compressive stress exceeds the second compressive stress.

3. The glass article of claim 1, wherein the compression layer comprises a sodium-diffused glass.

4. The glass article of claim 1, wherein the witness layer comprises a potassium-diffused glass.

5. The glass article of claim 1 wherein:
    the compression layer has a first index of refraction;
    the witness layer has a second index of refraction; and
    the second index of refraction exceeds the first index of refraction.

6. A lithium ion strengthened glass article comprising:
    an interior portion comprising a base glass and lithium ions;
    a witness layer having different thicknesses at different locations of the lithium ion strengthened glass article; and
    a compression layer between the interior portion and the witness layer; wherein:
    the compression layer is under compression;
    the compression layer has a lower content of lithium ions and a greater content of sodium ions than the interior portion;
    the witness layer is under compression; and
    the witness layer has a lower content of sodium ions and a greater content of potassium ions than the compression layer.

7. The lithium ion strengthened glass article of claim 6, wherein the compression layer has a thickness of about 1 to about 10% a thickness of the interior portion.

8. The lithium ion strengthened glass article of claim 7, wherein the witness layer has a thickness of about 1 to about 25 μm.

9. The lithium ion strengthened glass article of claim 6, wherein:
    the compression layer has a first index of refraction;
    the witness layer has a second index of refraction; and
    the second index of refraction exceeds the first index of refraction.

10. The lithium ion strengthened glass article of claim 6, wherein the lithium ion strengthened glass article is a cover glass for a portable electronic device.

11. A portable electronic device, comprising:
    a housing; and
    a cover glass affixed to the housing and defining:
        a central region; and
        a peripheral region adjacent the housing and surrounding the central region; wherein
    the cover glass is at least partially covered by a witness layer having a greater thickness at a first location within the central region than at a second location within the peripheral region; and
    the witness layer has a compressive stress differing from the cover glass.

12. The portable electronic device of claim 11, wherein:
    the cover glass comprises a layer of sodium-diffused glass; and
    the witness layer comprises a layer of potassium-diffused glass.

13. The portable electronic device of claim 11, wherein the housing is at least partially composed of sapphire.

14. A portable electronic device, comprising:
a component defining a first portion of a polished exterior surface of the portable electronic device; and
a glass cover having an outer surface defining a second portion of the polished exterior surface that is adjacent to and coplanar with the first portion, the glass cover comprising:
- a witness layer formed at the outer surface, comprising a first content of potassium ions, a first content of sodium ions, and a first content of lithium ions, and having a thickness at the second portion of the polished exterior surface less than a thickness at a location away from the second portion of the polished exterior surface;
- a compressive stress layer formed below the witness layer and comprising a second content of potassium ions less than the first content of potassium ions, a second content of sodium ions greater than the first content of sodium ions, and a second content of lithium ions greater than the first content of lithium ions; and
- an interior portion comprising a third content of lithium ions greater than the second content of lithium ions.

15. The portable electronic device of claim 14, wherein the witness layer is optically detectable using reflected light.

16. The portable electronic device of claim 15, wherein an index of refraction decreases with increasing depth in the witness layer.

17. The portable electronic device of claim 14, wherein a thickness of the witness layer formed at the second portion of the polished exterior surface is from about 1 μm to about 25 μm.

18. The portable electronic device of claim 14, wherein:
the witness layer is also formed at an interior surface of the glass cover; and
a thickness of the witness layer at the interior surface of the glass cover is greater than a thickness of the witness layer at the second portion of the polished exterior surface of the portable electronic device.

19. The portable electronic device of claim 14, wherein the third content of lithium ions is greater than or equal to 10 weight percent.

20. The portable electronic device of claim 14, wherein the glass cover is attached to a frame of a housing.

\* \* \* \* \*